(12) United States Patent
Liu et al.

(10) Patent No.: US 8,664,509 B2
(45) Date of Patent: Mar. 4, 2014

(54) THERMOELECTRIC APPARATUS AND METHOD OF FABRICATING THE SAME

(75) Inventors: Chun-Kai Liu, Taipei (TW); Ming-Ji Dai, Hsinchu (TW); Suh-Yun Feng, Hsinchu (TW); Li-Ling Liao, Changhua (TW)

(73) Assignee: Industrial Technology Research Institute, Hsinchu (TW)

( * ) Notice: Subject to any disclaimer, the term of this patent is extended or adjusted under 35 U.S.C. 154(b) by 202 days.

(21) Appl. No.: 13/040,477

(22) Filed: Mar. 4, 2011

(65) Prior Publication Data
US 2012/0118346 A1     May 17, 2012

(30) Foreign Application Priority Data

Nov. 15, 2010   (TW) ................................ 99139248 A

(51) Int. Cl.
*H01L 35/30*     (2006.01)
(52) U.S. Cl.
USPC ........... 136/205; 136/201; 136/204; 136/220; 136/224; 136/225; 136/238; 136/239; 136/240
(58) Field of Classification Search
USPC ................................................. 136/200–242
See application file for complete search history.

(56) References Cited

U.S. PATENT DOCUMENTS

| | | | |
|---|---|---|---|
| 3,615,870 A * | 10/1971 | Crouthamel | ................... 136/204 |
| 3,955,204 A | 5/1976 | Anton | |
| 4,049,469 A * | 9/1977 | Kolomoets et al. | ........... 136/225 |
| 4,072,864 A | 2/1978 | von Gutfeld | |
| 4,829,771 A | 5/1989 | Koslow et al. | |
| 4,922,822 A * | 5/1990 | Bierschenk et al. | .......... 136/204 |
| 4,987,376 A | 1/1991 | Hughes | |
| 5,075,555 A | 12/1991 | Woldseth et al. | |
| 5,089,054 A | 2/1992 | Sievers | |
| 5,288,336 A | 2/1994 | Strachan et al. | |
| 5,430,322 A * | 7/1995 | Koyanagi et al. | ............. 257/467 |

(Continued)

FOREIGN PATENT DOCUMENTS

| CN | 101237061 | 8/2008 |
|---|---|---|
| CN | 101237061 A | 8/2008 |

OTHER PUBLICATIONS

English language translation of abstract of CN 101237061 (published Aug. 6, 2008).

(Continued)

*Primary Examiner* — James Lin
*Assistant Examiner* — Liesl C Baumann
(74) *Attorney, Agent, or Firm* — McClure, Qualey & Rodack, LLP

(57) ABSTRACT

A thermoelectric apparatus includes a first and a second assemblies, at least a first and a second heat conductors. The first assembly includes a first and a second substrates, and several first thermoelectric material sets disposed between the first and second substrates. The first substrate has at least a first through hole. The second assembly includes a third and a fourth substrates, and several second thermoelectric material sets disposed between the third and fourth substrates. The fourth substrate has at least a second through hole. Each of the first and second thermoelectric material sets has a p-type and an n-type thermoelectric element. The first and second heat conductors respectively penetrate the first and second through holes. Two ends of the first heat conductor respectively connect the second and fourth substrates, while two ends of the second heat conductor respectively connect the first and third substrates.

17 Claims, 7 Drawing Sheets

(56) References Cited

U.S. PATENT DOCUMENTS

| | | | |
|---|---|---|---|
| 5,450,869 A | 9/1995 | Brittain et al. | |
| 5,564,276 A | 10/1996 | Abadilla et al. | |
| 5,753,383 A | 5/1998 | Cargnelli et al. | |
| 5,966,939 A | 10/1999 | Tauchi | |
| 6,207,887 B1 | 3/2001 | Bass et al. | |
| 6,347,521 B1 * | 2/2002 | Kadotani et al. | 62/3.7 |
| 6,401,461 B1 | 6/2002 | Harrison et al. | |
| 6,710,238 B1 | 3/2004 | Shingu et al. | |
| 6,855,880 B2 | 2/2005 | Feher | |
| 7,257,000 B2 | 8/2007 | Pfahnl et al. | |
| 7,261,961 B2 | 8/2007 | Kamachi et al. | |
| 7,448,222 B2 | 11/2008 | Bormann | |
| 2003/0066554 A1 | 4/2003 | Feher | |
| 2003/0121540 A1 * | 7/2003 | Onoue | 136/212 |
| 2004/0171970 A1 | 9/2004 | Schleuniger et al. | |
| 2006/0000500 A1 * | 1/2006 | Sauciuc et al. | 136/201 |
| 2006/0180192 A1 * | 8/2006 | Sharp et al. | 136/224 |
| 2007/0028955 A1 * | 2/2007 | Sogou et al. | 136/200 |
| 2007/0095381 A1 | 5/2007 | Lee | |
| 2008/0035195 A1 * | 2/2008 | Bell | 136/206 |
| 2008/0142069 A1 | 6/2008 | Lindstrom | |
| 2008/0245397 A1 | 10/2008 | Moczygemba et al. | |
| 2008/0245398 A1 | 10/2008 | Bell et al. | |
| 2009/0031538 A1 | 2/2009 | Reichel | |
| 2009/0165835 A1 | 7/2009 | Chu | |
| 2009/0301538 A1 | 12/2009 | Lindstrom | |
| 2009/0301541 A1 * | 12/2009 | Watts | 136/205 |
| 2010/0019619 A1 * | 1/2010 | Hagg | 310/306 |
| 2010/0163090 A1 * | 7/2010 | Liu et al. | 136/224 |
| 2010/0224226 A1 | 9/2010 | Feng et al. | |
| 2011/0247670 A1 * | 10/2011 | Ohmura et al. | 136/212 |

OTHER PUBLICATIONS

Horio, Y., et al.; "Application of Thermoelectric Modules Fabricated with (Bi,Sb)2(Te,Se)3 using Rapid Solidification Technique for the Projector System;" IEEE;2006; pp. 363-366.

Yang, J., et al.; "Potential Applications of Thermoelectric Waste Heat Recovery in the Automotive Industry;" IEEE; 2005; pp. 155-159.

Kaibe, H.T., et al.; "Development of Thermoelectric Generating Cascade Modules using Silicide and Bi-Te;" EU Science and Technology Fellow; pp. 1-4.

Bell, L.E.; "Cooling, Heating, Generating Power, and Recovering Waste Heat with Thermoelectric Systems;" www.sciencemag.org; Feb. 18, 2011; pp. 1456-1461.

English Abstract translation of CN101237061 (Published Aug. 6, 2008).

* cited by examiner

THERMOELECTRIC APPARATUS AND METHOD OF FABRICATING THE SAME

This application claims the benefit of Taiwan application Serial No. 099139248, filed Nov. 15, 2010, the subject matter of which is incorporated herein by reference.

BACKGROUND

1. Technical Field

The disclosure relates in general to a thermoelectric apparatus and a method of fabricating the same, and more particularly to a thermoelectric apparatus capable of increasing power output of thermoelectric modulec and a method of fabricating the same.

2. Description of the Related Art

The problem of energy shortage has made the development of renewable energy technologies become an important issue. Take the vehicles for example. The waste heat of the engine of some vehicles amounts to about 33% of the power, and fuel consumption can be reduced if the exhaust heat can be used for power generation by way of thermoelectric temperature difference. Additionally, factories and households both discharge a large amount of waste heat. Therefore, how to recycle the discharged waste heat has also become an important issue. Currently, there still lacks suitable technologies for recycling the waste heat, particularly the waste heat generated by low temperature thermal source, and the energy loss is considerable.

Thermoelectric device is a device for converting thermal energy to electrical energy and vice versa. Based on the properties of thermoelectric conversion, two fields of application, namely heating/cooling capacity and power generation, are created. According to the Seebeck effect, when an n-type semiconductor material and a p-type semiconductor material that are electrically coupled contact different temperatures at the p material connection end and the n material connection end respectively, energy is transferred, and electrical current is generated in the thermocouple. The thermoelectric conversion can be used in waste heat power generation for generating power according to the temperature difference at the two ends of a thermoelectric device which is a heat generator. On the other hand, according to the Peltier effect, when a direct current is applied to a thermoelectric device, heat absorption and heat dissipation will occur to the two ends of the thermoelectric device respectively, and such principle can be used in the cooling or heating technologies.

Referring to FIG. 1, a cross-sectional view of an apparatus using a conventional thermoelectric device is shown. In general, a conventional thermoelectric conversion apparatus is composed of a p-type thermoelectric material 101, an n-type thermoelectric material 102, conductive metal layers 111a and 111b, a top substrate 121a and a bottom substrate 121b. The p-type thermoelectric material 101 and the n-type thermoelectric material 102 are lump-shaped, and both of the top substrate 121a and the bottom substrate 121b possess electrical insulation and high thermal conductivity. The functions of the thermoelectric device are mainly determined by the properties of the thermoelectric materials 101 and 102. As indicated in FIG. 1, the p-type thermoelectric material 101 and the n-type thermoelectric material 102 are normally vertically type, and are connected in series via the conductive metal layers 111a and 111b. The top and bottom substrates 121a and 121b with electrical insulation and high thermal conductivity, for example, are made of ceramic material. In the application of thermoelectric cooling module, the inputted direct current flows in the p-type thermoelectric materials 101 and the n-type thermoelectric materials 102 in a direction (vertically flow) parallel to that of thermal flow (vertically transferring) of the conversion device, and the thermoelectric cooling module generates temperature difference, and absorb and dissipate the heat at the top and the bottom, respectively. Take power generation by way of temperature difference for example. The directions of the thermoelectric device temperature difference and thermal flow are still parallel to the flow direction of the current generated in the thermoelectric materials. However, the cooling capacity and power generation efficiency of the thermoelectric devices with conventional structure are subjected to the restriction in figure of merit (ZT) of the lump-shaped thermoelectric materials, and the maximum cooling capacity of some commercial thermoelectric devices reach 3~5 W/cm$^2$ only, and the power generation efficiency of such thermoelectric device is about 2~3% when the temperature difference between the cooling end and the heating end is 200. To increase the power generation efficiency of the thermoelectric device, thermoelectric materials with high ZT value has been proposed for using in the thermoelectric device.

Despite many studies have been proposed for enhancing the properties of thermoelectric materials and improving the efficiency of thermoelectric devices, the achievements are still limited. When the ZT value of a thermoelectric material is smaller than 1, the performance of the thermoelectric device will be restricted. In 1993, Professors Hicks and Dresselhaus et al of the MassaChusetts Institute of Technology of USA suggested that the ZT value could be effectively increased if the scale of thermoelectric materials is downsized to nano level. In 2001, Venkatasubramanian et al of the RTI (Research Triangle Institute) of USA disclosed that the ZT value of the p-type $Bi_2Te_3/Sb_2Te_3$ super-lattice thin film can reach 2.4 at room temperature, marking a breakthrough for the bottleneck that the ZT is about 1.

In the field of material technology, the thermoelectric materials with high thermoelectric performance (the ZT value) continue to be developed. It is also an important direction in the development of technology to design a thermoelectric devices or structures capable of generating larger volume of power.

SUMMARY

According to an embodiment of the disclosure, a thermoelectric apparatus including a first assembly, a second assembly, at least a first heat conductor, and at least a second heat conductor is provided. The first assembly includes a first substrate and a second substrate opposite to each other, and several first thermoelectric material sets disposed between the first and second substrates, wherein the first substrate has at least a first through hole. The second assembly, stacked above the first assembly, includes a third substrate and a fourth substrate opposite to each other, and several second thermoelectric material sets disposed between the third and fourth substrates, wherein the fourth substrate has at least a second through hole. Each of the first and second thermoelectric material sets has a p-type thermoelectric element and an n-type thermoelectric element electrically connected to each other. The first heat conductor penetrates the first through hole of the first high temperature substrate, and two ends of the first heat conductor connect the fourth and second low temperature substrates, respectively. The second heat conductor penetrates the second through hole of the fourth substrate, and two ends of the second heat conductor connect the first and third substrates, respectively.

According to another embodiment of the disclosure, a method for fabricating thermoelectric apparatus is provided. Firstly, a first substrate is provided, wherein at least a first heat conductor and several first thermoelectric material sets are disposed vertically on the first substrate, and each first thermoelectric material set has a p-type thermoelectric element and an n-type thermoelectric element electrically connected to each other. A first substrate is disposed on the first thermoelectric material sets, wherein the first substrate has at least a first through hole for the first heat conductor to penetrate through. A second heat conductor is disposed on the first substrate. A second substrate is disposed on the first heat conductor, wherein the second substrate has at least a second through hole, several second thermoelectric material sets are disposed vertically on the second substrate, each second thermoelectric material set has a p-type thermoelectric element and an n-type thermoelectric element electrically connected to each other, and the second heat conductor penetrates the second through hole. Afterwards, a third substrate is disposed on the second thermoelectric material sets, wherein one end of the second heat conductor is connected to the third substrate.

The above and other aspects of the disclosure will become better understood with regard to the following detailed description of the non-limiting embodiment(s). The following description is made with reference to the accompanying drawings.

DETAILED DESCRIPTION

A thermoelectric apparatus and a method of fabricating the same are disclosed in a number of embodiments below. The structure of one embodiment of the thermoelectric apparatus includes several layers of thermoelectric modules stacked vertically. The thermoelectric apparatus is coupled to a thermal source for performing the thermoelectric conversion. Each layer of thermoelectric module includes a substrate with relative high temperature, a substrate with relative low temperature, the p-type thermoelectric elements and the n-type thermoelectric elements. An upper conductive layer and a lower conductive layer are respectively disposed on the top and the bottom of each layer of elements for serially connecting the p-type thermoelectric elements and the n-type thermoelectric elements, respectively. The thermal conductive material vertically penetrates the through hole of the substrate with relative low temperature of the thermoelectric module disposed at the upper layer, and connects the substrates with relative high temperature of the thermoelectric modules respectively disposed at the upper layer and at the lower layer. Also, another thermal conductive material vertically penetrates the through hole of the substrate with relative high temperature of the thermoelectric module disposed at the lower layer, and connects the substrates with relative low temperature of the thermoelectric modules respectively disposed at the upper layer and at the lower layer.

A first embodiment and a second embodiment are disclosed below for elaborating the structure of the thermoelectric apparatus. However, the detailed structure and manufacturing processes disclosed in the embodiments of the disclosure are for detailed descriptions only, not for limiting the scope of protection of the disclosure.

First Embodiment

Figure 1:
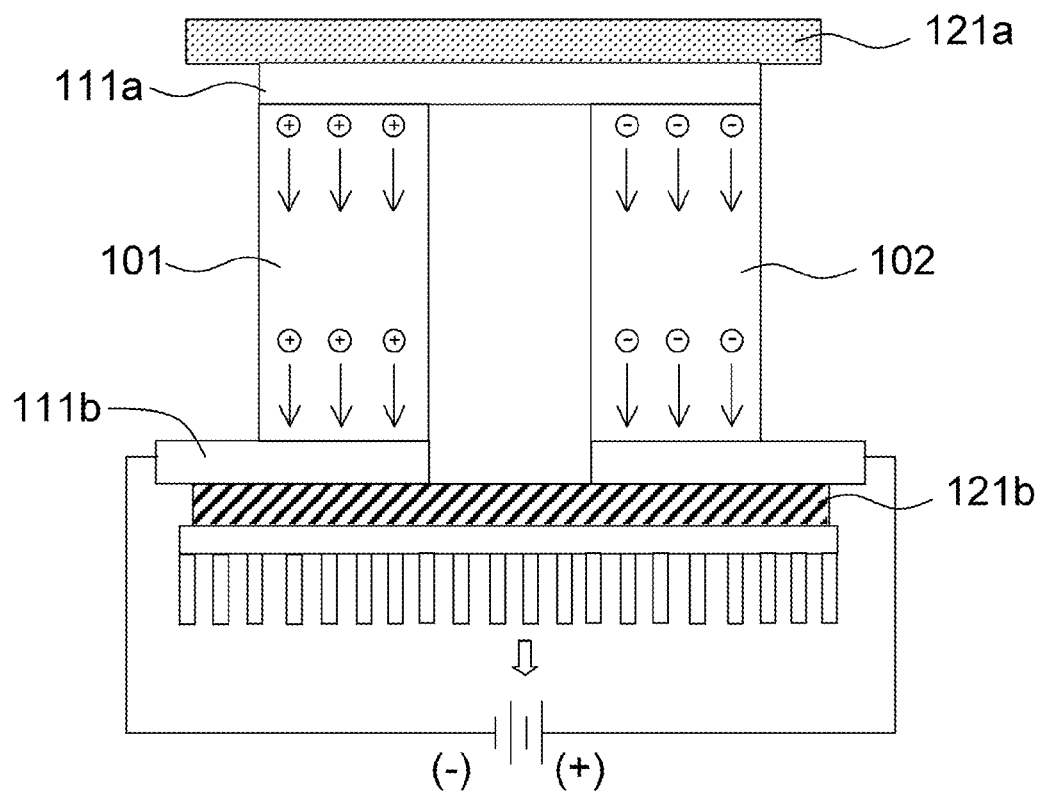
FIG. 1 is a cross-sectional view of an apparatus using a conventional thermoelectric device.
Figure 2:
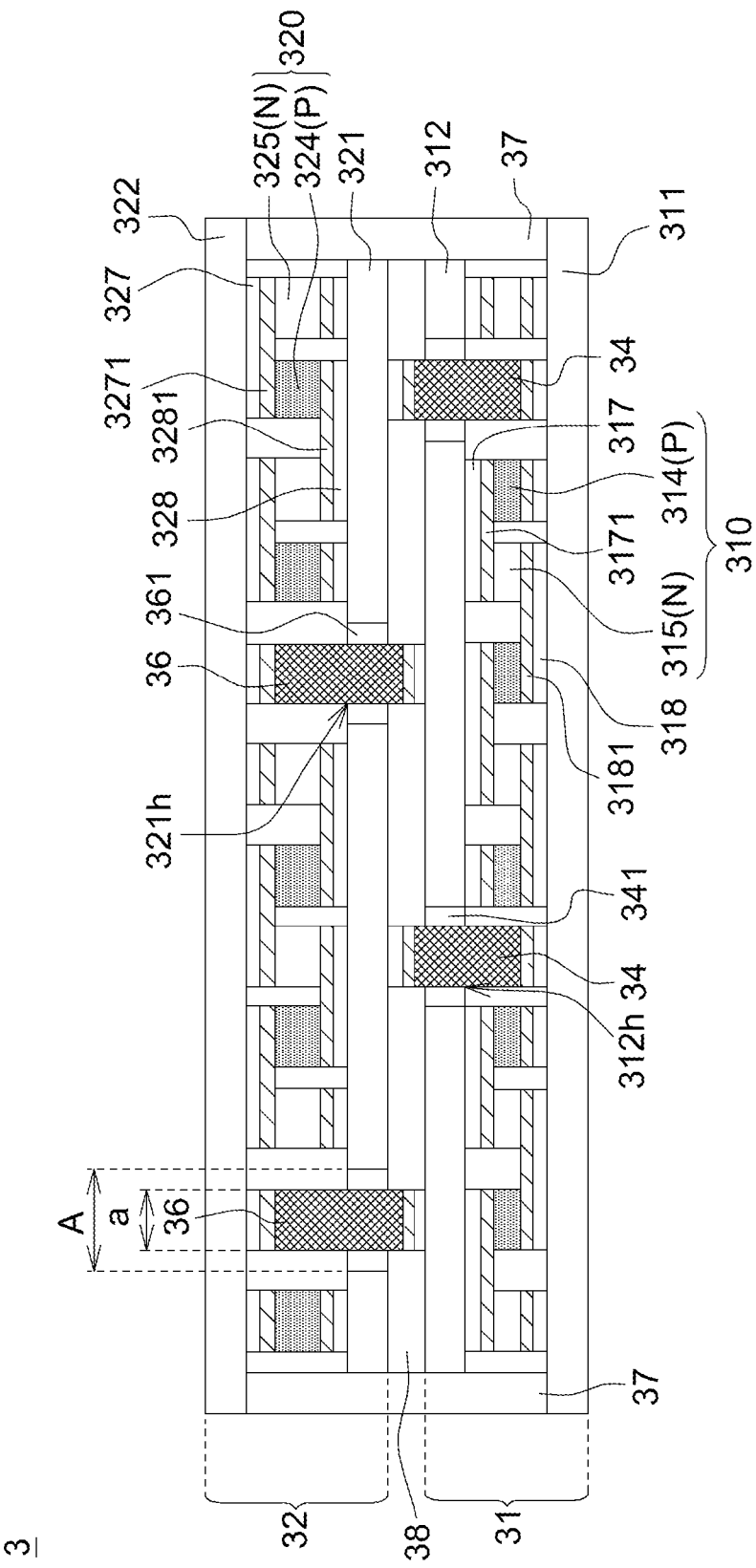
FIG. 2 shows a thermoelectric apparatus according to a first embodiment of the disclosure.

Referring to FIG. 2, a thermoelectric apparatus according to a first embodiment of the disclosure is shown. The thermoelectric apparatus 3 includes a first assembly 31 and a second assembly 32, wherein the second assembly 32 is vertically stacked above the first assembly 31. The first assembly 31 includes a first substrate 312 and a second substrate 311 disposed oppositely to each other, wherein the first substrate 312 has at least a first through hole 312h. In FIG. 2, two first through holes 312h are exemplified for illustration. The first assembly 31 further includes several first thermoelectric material sets 310, disposed vertically between the first substrate 312 and the second substrate 311. Each first thermoelectric material set 310 has a p-type thermoelectric element 314 and an n-type thermoelectric element 315 electrically connected to each other (ex: electrically connected by a conductor 317 using a conductive bonding material 3171). The n-type thermoelectric element 315 of each first thermoelectric material set 310 is electrically connected to the p-type thermoelectric element 314 of the adjacent first thermoelectric material set 310 (ex: electrically connected by a conductor 318 using a conductive bonding material 3181).

Likewise, the second assembly 32 includes a third substrate 322 and a fourth substrate 321 disposed oppositely to each other, wherein the fourth substrate 321 has at least a second through hole 321h. In FIG. 2, two second through holes 321h are exemplified for illustration. The second assembly 32 further includes several second thermoelectric material sets 320, disposed vertically between the third substrate 322 and the fourth substrate 321. Each second thermoelectric material set 320 has a p-type thermoelectric element 324 and an n-type thermoelectric element 325 electrically connected to each other (ex., electrically connected by a conductor 327 via a conductive bonding material 3271). The n-type thermoelectric element 325 of each first thermoelectric material set 310 is electrically connected to the p-type thermoelectric element 324 of the adjacent first thermoelectric material set 320 (ex., electrically connected by a conductor 328 via a conductive bonding material 3281).

The thermoelectric apparatus 3 further includes at least a first heat conductor 34 and a second heat conductor 36. In FIG. 2, two first heat conductors 34 and two second heat conductors 36 are respectively exemplified for illustration, but the quantities of the through holes and the heat conductors of the disclosure are not limited to two. The first heat conductor 34 penetrates the first through hole 312h, wherein two ends of the first heat conductor 34 connect the second substrate 311 and the fourth substrate 321, respectively. The second heat conductor 36 penetrates the second through hole 321h, and two ends of the second heat conductor 36 connect the third substrate 322 and the first substrate 312 respectively, wherein the opening of the through hole is larger than the cross-section of the heat conductor. Take the opening A of the second through hole 321 h for example. The opening A of the second through hole 321h is larger than the cross-section area of the second heat conductor 36. Moreover, the cross-section area, quantity and position of the heat conductors are determined according to actual needs, and the disclosure does not have any specific restrictions.

The heat conductor and the through hole can be isolated by air or an insulating material. As indicated in FIG. 2, a first thermal insulating material 341 is disposed between the first through hole 312$h$ and the first heat conductor 34 for isolating thermal transfer between the first heat conductor 34 and the first substrate 312, and a second thermal insulating material 361 is disposed between the second through hole 321$h$ and second heat conductors 36 for isolating thermal transfer between the second heat conductor 36 and the fourth substrate 321.

Figure 3:
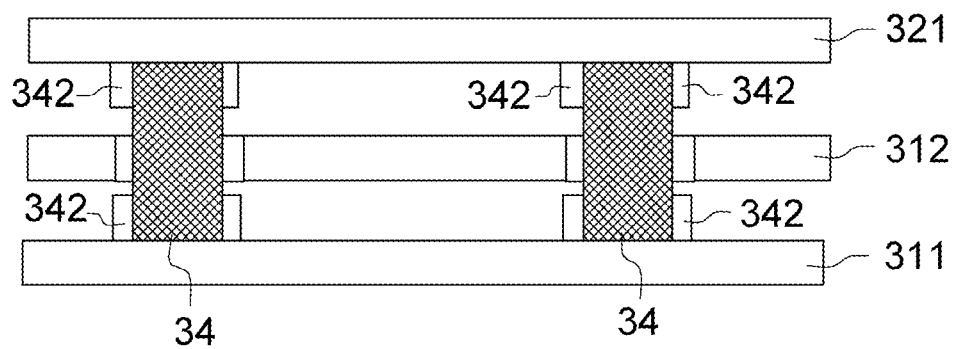
FIG. 3 shows another way of thermal insulation by heat conductor of an embodiment of the disclosure.

In addition to the way of isolating thermal transfer as indicated in FIG. 2, another way of thermal insulation for heat conductor is indicated in FIG. 3. The heat conductor is surrounded by a thermal insulating material so that element reliability is increased. For example, the first heat conductor 34 is surrounded by a first thermal insulating material 342. Alternatively, an even better effect of thermal isolation can be achieved by using the isolation ways illustrated in FIG. 2 and FIG. 3 simultaneously.

Figure 4:
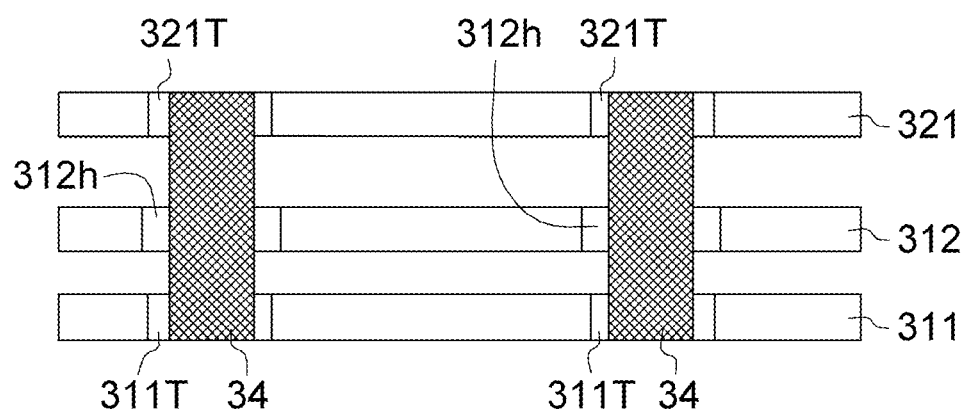
FIG. 4 shows another way of disposition of a heat conductor of an embodiment of the disclosure.

Furthermore, the heat conductor and the substrate can be bonded by way of soldering or by a mechanism such as a recess disposed on the substrate, and the disclosure does not have specific restrictions. In addition to the way of disposing the first and second heat conductors 34 and 36 on their corresponding substrates as indicated in FIG. 2, the two ends of the heat conductor can respectively penetrate their corresponding substrate by way of setting the heat conductor as indicated in FIG. 4. For example, a first through hole 311T and a second through hole 321T are formed on the second substrate 311 and the fourth substrate 321 respectively, wherein two ends of the first heat conductor 34 are located inside the first through hole 311T and the second through 321T respectively and are then bonded with the second substrate 311 and the fourth substrate 321 to further increase the effect of thermal transfer.

In an embodiment, the modules of the thermoelectric apparatus can be sealed or surrounded by a frame made of a material with low thermal conductivity. The assembly 3 illustrated in FIG. 2 further includes a sealing material 37 disposed between the second substrate 311 and the third substrate 322, and the assembly 3 can be further vacuumed and sealed. After sealing, the state of the assembly 3 can be nearly full vacuum or partial vacuum, thereby isolating thermal transfer and convection. The sealing material 37 can be made of a material with low thermal conductivity. In other embodiment, the thermoelectric apparatus may further include a structure (not illustrated) capable of reducing radiation transfer, hence avoiding the thermal radiation deteriorating the effect of temperature difference, and enabling the assembly to maintain temperature difference power generation for a long duration.

Moreover, the thermoelectric apparatus may further include a number of conductive wires (not shown in the drawings) connected to the p-type and n-type thermoelectric elements 314 and 315 of the first assembly 31 and the p-type and n-type thermoelectric elements 324 and 325 of the second assembly 32 respectively. In the application of power generation, when suitable temperatures are applied to the substrates, for example, the temperatures applied to the first and third substrates 312 and 322 are relative high and the temperatures applied to the second and fourth substrates 311 and 321 are relative low, the power generated by the thermoelectric apparatus due to the temperature difference can be transferred via the conductive wires (used as electrodes). The conductive wires can be processed in many different ways. If the assembly adopts a vacuum structure and a lower temperature, then the conductive wires can be encapsulated by a molding compound. If the assembly adopts a higher temperature, then the through hole is sealed after the conductive wires pass the through hole. However, the disclosure does not have specific restriction regarding the conductive wires.

In the present embodiment, there is a space (gap), such as an air layer or a vacuum layer, between the first substrate 312 of the first assembly 31 and the fourth substrate 321 of the second assembly 32. The space (gap) can be interposed with a thermal insulating material with low thermal conductivity realized by such as polymer or plastics. Thus, the gap functions as a thermal insulating layer 38, which separates the heating end and the cooling end of two layers (that is, the first assembly 31 and the second assembly 32) of the thermoelectric module and isolates thermal transfer between the two ends. Thus, the thermal transfer between the upper thermal layer and the lower thermal layer is isolated, the temperature difference between the thermal layers is widened during power generation, thereby enhancing the effect of power generation.

Also, the second and fourth substrates 311 and 321 as well as the first and third substrates 312 and 322 possess electrical insulation and high thermal conductivity, and can be made of a ceramic material with high thermal conductivity realized by such as aluminum oxide, aluminum nitride and silicon carbide, or a silicon or metal substrate whose surface is covered with an insulating dielectric layer. However, the disclosure does not have specific restrictions regarding the choice of materials in practical application.

In the embodiment, the p-type thermoelectric elements 314 and 324 and the n-type thermoelectric elements 315 and 325 are made of a semiconductor or a semi-metal element or compound possessing high ZT value, such as bismuth telluride ($(BiSb)_2 (TeSe)_3$) series, bismuth telluride (Bi2Te3), lead telluride (PbTe) and tin telluride (PbSnTe) series that are doped with antimony and selenium, or compound series such as silicon (Si) and silicon germanium (SiGe) series, half-Heusler dielectric alloy series (a strong magnetic non-iron alloy), silicide, or tungsten diselenide ($WSe_2$) series. Moreover, the thermoelectric elements can be formed by way of sputtering, thermal evaporation, arc ion plating, chemical vapor evaporation, electroplating and chemical plating. However, in practical application, the choice of materials and the ways of formation are determined according to the actual needs and practical conditions, and the disclosure does not have specific restrictions.

The conductors, which electrically connect the p-type thermoelectric elements and the n-type thermoelectric elements, can be realized by the metal conductors 317, 318, 327, and 328 and made of conductive metal such as alloy, or metal with low resistance such as copper (Cu), iron (Fe), chrome (Cr), nickel (Ni), molybdenum (Mo), tin (Sn), silver (Ag), gold (Au) and so on. The first the conductor 35 and the second the conductor 36 can be realized by heat conductive pillars made from metal, alloy or ceramic material with high thermal conductivity. However, in practical application, the choice of material and the shape of the conductors are determined according to actual needs and conditions, and the disclosure does not have specific restrictions.

Second Embodiment

Figure 5:
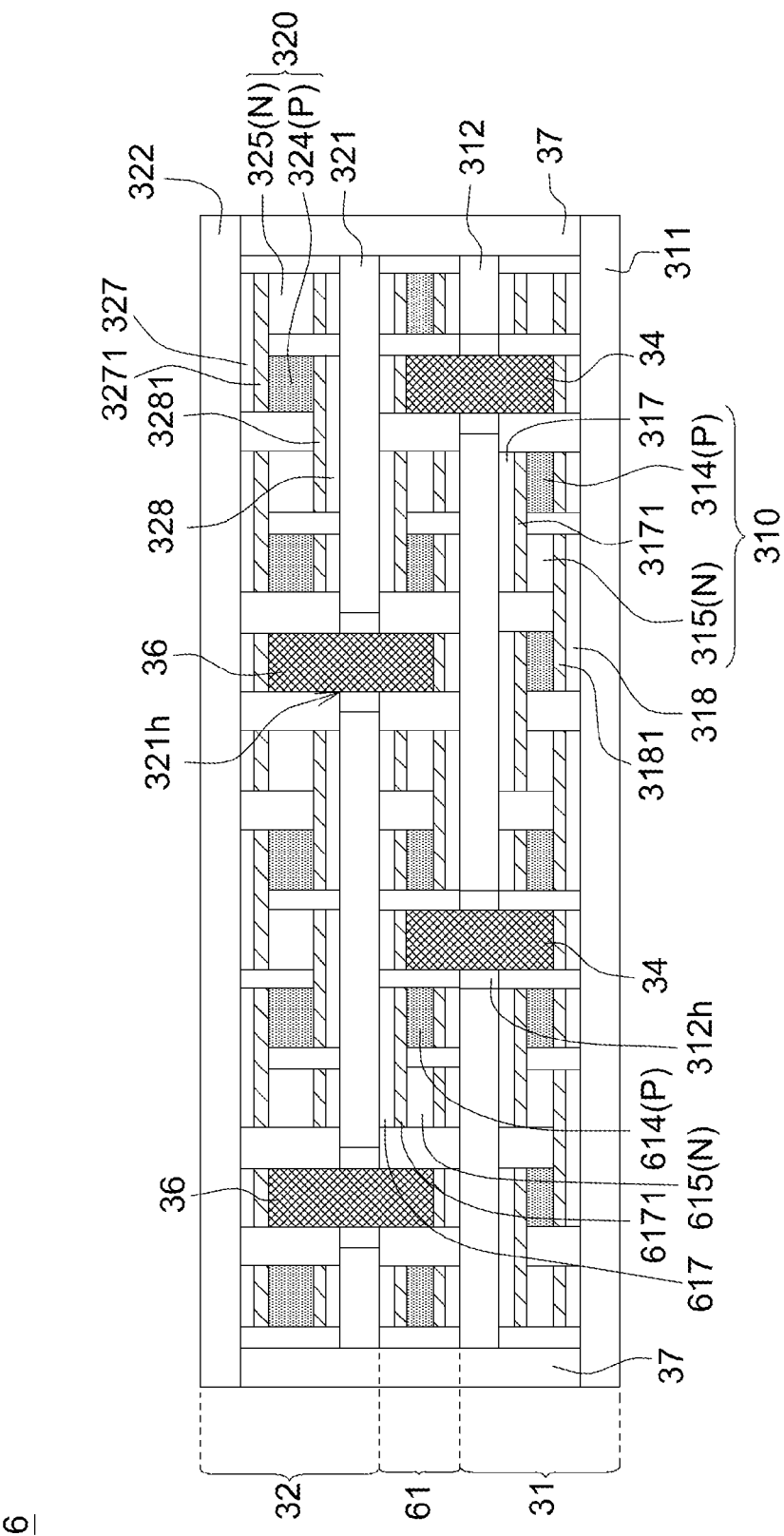
FIG. 5 shows a thermoelectric apparatus according to a second embodiment of the disclosure.

Referring to FIG. 5, a thermoelectric apparatus according to a second embodiment of the disclosure is shown. The elements of the second embodiment identical to the first embodiment (as shown in FIG. 2) are designated as the same reference numbers.

The thermoelectric apparatus 6 of the second embodiment is very similar to the assembly 3 of the first embodiment, except that several thermoelectric material sets are further disposed between the first assembly 31 and the second assembly 32.

As indicated in FIG. 5, the thermoelectric apparatus 6 includes a first assembly 31 and a second assembly 32, wherein the second assembly 32 is vertically stacked above the first assembly 31. The first assembly 31 includes a second substrate 311 and a first substrate 312 (has a first through hole 312h) disposed oppositely to each other, wherein the first substrate 312 has a first through hole 312h. The second assembly 32 includes a fourth substrate 321 and a third substrate 322 disposed oppositely to each other, wherein the fourth substrate 321 has a second through hole 321h. The first assembly 31 further has several first thermoelectric material sets 310 disposed between the second substrate 311 and the first substrate 312. Each first thermoelectric material set 310 has a p-type thermoelectric element 314 and an n-type thermoelectric element 315 electrically connected to each other (for example, the p-type thermoelectric element 314 and the n-type thermoelectric element 315 are electrically connected by a conductor 317 via a conductive bonding material 3171). The n-type thermoelectric element 315 of each first thermoelectric material set 310 is electrically connected to the p-type thermoelectric element 314 of the adjacent first thermoelectric material set 310 (for example, the p-type thermoelectric element 314 and the n-type thermoelectric element 315 are electrically connected by a conductor 318 via a conductive bonding material 3181). The second assembly 32 has several second thermoelectric material sets 320 disposed between the third substrate 322 and the fourth substrate 321. Each second thermoelectric material set 320 has a p-type thermoelectric element 324 and an n-type thermoelectric element 325 electrically connected to each other (for example, the p-type thermoelectric element 324 and the n-type thermoelectric element 325 electrically connected by a conductor 327 via a conductive bonding material 3271). The n-type thermoelectric element 325 of each thermoelectric material set is electrically connected to the p-type thermoelectric element 324 of the adjacent thermoelectric material set (for example, the n-type thermoelectric element 325 and the p-type thermoelectric element 324 are electrically connected by a conductor 328 via a conductive bonding material 3281). The thermoelectric apparatus 6 also includes at least a first heat conductor 34 and a second heat conductor 36, wherein the first heat conductor 34 penetrates the first through hole 312h, and the two ends of the first heat conductor respectively connect the second substrate 311 and the fourth substrate 321, while the second heat conductor 36 penetrates the second through hole 321h, and the two ends of the second heat conductor respectively connect the third substrate 322 and the first substrate 312.

In the second embodiment, the thermoelectric apparatus 6 further includes several third thermoelectric material sets 61, disposed vertically between the first substrate 312 of the first assembly 31 and the fourth substrate 321 of the second assembly 32. Similarly, each third thermoelectric material set has a p-type thermoelectric element 614 and an n-type thermoelectric element 615 electrically connected to each other (for example, electrically connected by a conductor 617 via a conductive bonding material 6171). The n-type thermoelectric element of each third thermoelectric material sets 61 can also be electrically connected to the p-type thermoelectric element of the adjacent third thermoelectric material set. In the second embodiment, more layers of thermoelectric devices are stacked. The first heat conductor 34 and the second heat conductor 36 (made of material with high thermal conductivity) directly transfer the heat to the substrate of the thermoelectric module of another layer, thereby maintaining the high and low temperature sides of the thermoelectric module maintain in a sufficient high temperature and low temperature. Accordingly, each layer of thermoelectric module can generate sufficient power, and the power generation capacity is increased through the stacked multi-layer structure of thermoelectric device.

Other elements similar to the first embodiment are not redundantly described here.

Thermal Transfer Simulation

An experiment of thermal transfer simulation is conducted for observing the correlations of power generation capacity between the structure of the embodiment and the whole module. In the experiment of thermal transfer simulation, the first implementation of simulation (i.e. the first comparison example) employs a single-layer structure, which is a layer of thermoelectric material set interposed between an upper substrate and a lower substrate. When the high/low temperatures of about 300 and 50 are respectively applied to two substrates, the simulated result of power generation is about 30W.

The second implementation of simulation (i.e. the second comparison example) employs a multi-layer structure, which is the same with the structure of the second embodiment (including four substrates and three layers of thermoelectric material sets) but is lack of the heat conductors 34 and 36. When the temperatures of about 50, 133, 216 and 300 are respectively applied to the second substrate 311, the first substrate 312, the fourth substrate 321 and the third substrate 322 in a bottom-up manner, the simulated result of power generation is merely about 10W.

The third implementation of simulation also employs a multi-layer structure, which is the same with the structure of the second embodiment and also includes the heat conductors 34 and 36. Again, temperatures of about 50, 198, 152 and 300 are applied to the second substrate 311, the first substrate 312, the fourth substrate 321 and the third substrate 322 in order, and the simulated result of power generation is up to about 60W.

According to the simulation results of thermal transfer, the structure of the embodiment really results in the well maintenance of temperature differences between the substrates, thereby increasing the power generation capacity of the whole module. The experiment of assembly of actual module also shows that the module design of the embodiment really widens the temperature differences between the substrates, and boosts the power generation capacity.

Fabricating Method of Assembly

A method for fabricating thermoelectric apparatus according to an embodiment of the disclosure is disclosed below. However, the processes of the method are for detailed description only, not for limiting the scope of the disclosure, and anyone who is skilled in the technology of the disclosure can make modification or adjustment to the processes according to actual needs in implementation.

FIG. 6A~FIG. 6E show processes of a method for fabricating a thermoelectric apparatus according to a second embodiment of the disclosure.

Figure 6A:
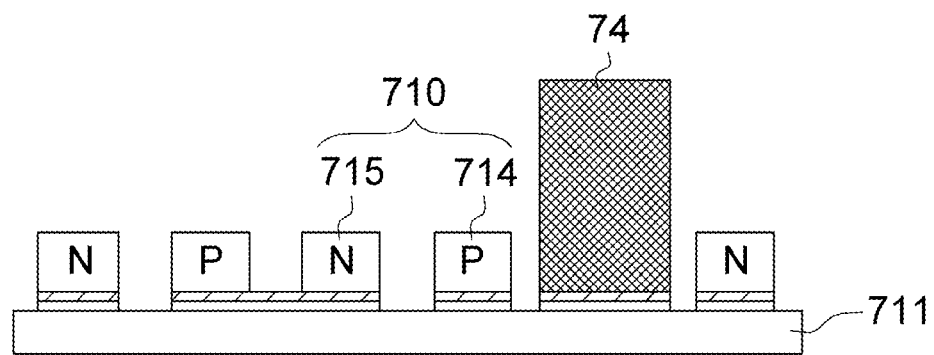
FIG. 6A~FIG. 6E show processes of a method for fabricating a thermoelectric apparatus according to a second embodiment of the disclosure.
Figure 6B:
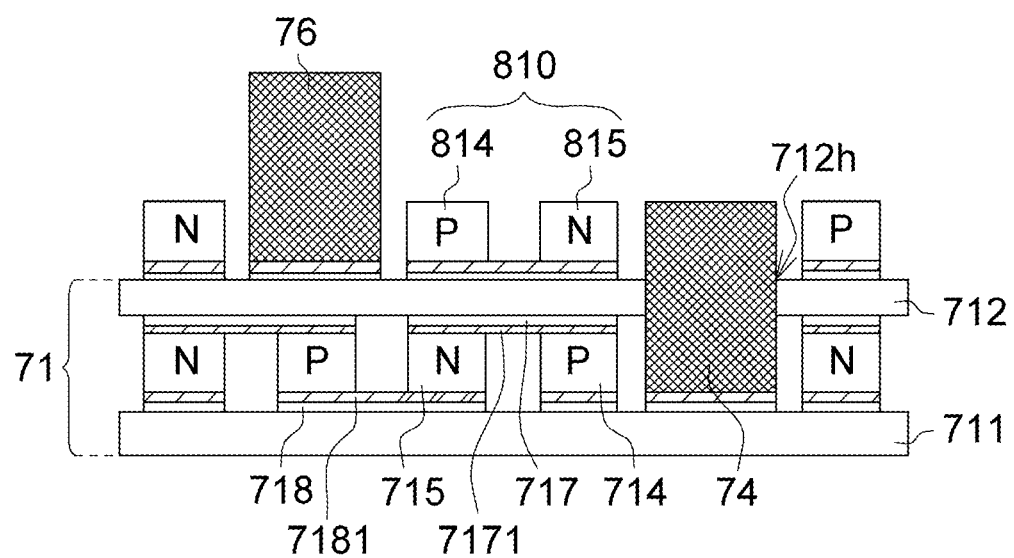

Firstly, a second substrate 711 is provided, wherein at least a first heat conductor 74 and several first thermoelectric material sets 710 are disposed vertically on the second substrate 711, and each first thermoelectric material set 710 has a p-type thermoelectric element 714 and an n-type thermoelectric element 715 as shown in FIG. 6A. Next, a first substrate 712 at least having a first through hole 712h is provided, and the first substrate 712 is disposed on the first thermoelectric material sets, and the first heat conductor 74 passes through the first through hole 712h, and several third thermoelectric material sets 810 each having a p-type thermoelectric element 814 and an n-type thermoelectric element 815 are disposed on the first substrate 712. A second heat conductor 76 is disposed on the first substrate 712 as shown in FIG. 6B.

Thus, a first assembly 71 has been formed by the second substrate 711, the first substrate 712 and several first thermoelectric material sets 710 disposed between the second substrate 711 and the first substrate 712. The p-type thermoelectric element 714 and the n-type thermoelectric element 715 of each first thermoelectric material set 710 are electrically connected by a conductor 717 (via a conductive bonding material 7171). The p-type thermoelectric element 714 and is electrically connected to the n-type thermoelectric element 715 of the adjacent first thermoelectric material set by a conductor 718 (via a conductive bonding material 7181).

Figure 6C:
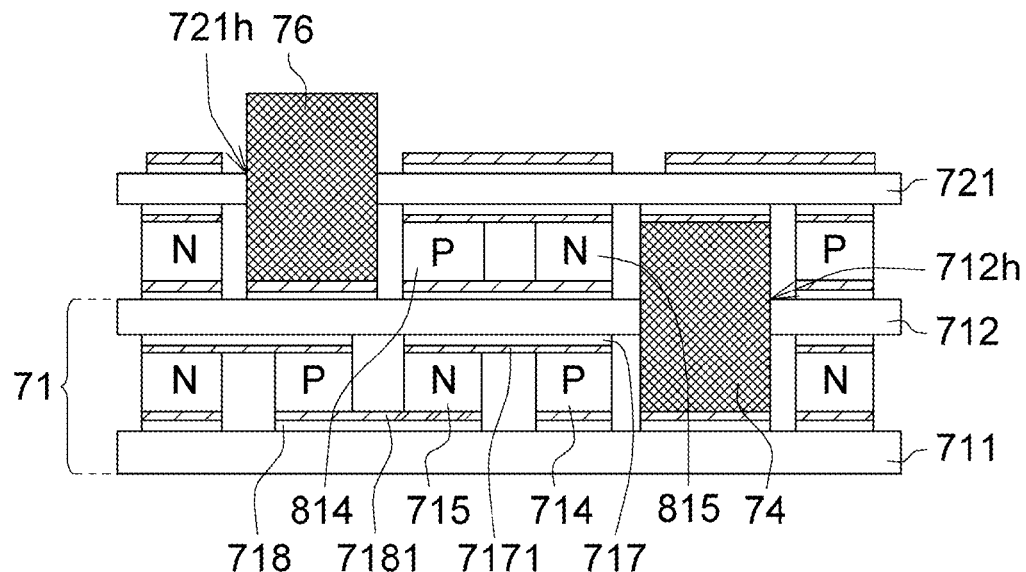

Afterwards, a fourth substrate 721 is provided, wherein the fourth substrate 721 at least has a second through hole 721h, the first heat conductor 74 is disposed on the fourth substrate 721, and the second heat conductor 76 passes through the second through hole 721h as shown in FIG. 6C.

Figure 6D:
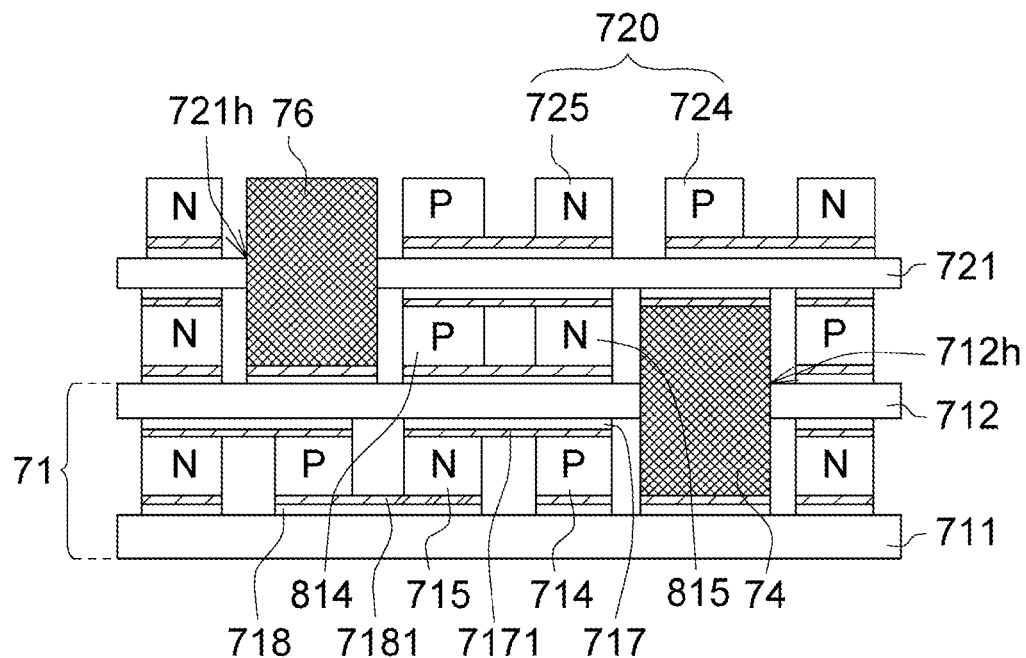

Then, several second thermoelectric material sets 720 are disposed vertically on the fourth substrate 721, wherein each second thermoelectric material set 720 has a p-type thermoelectric element 724 and an n-type thermoelectric element 725 as shown in FIG. 6D.

Figure 6E:
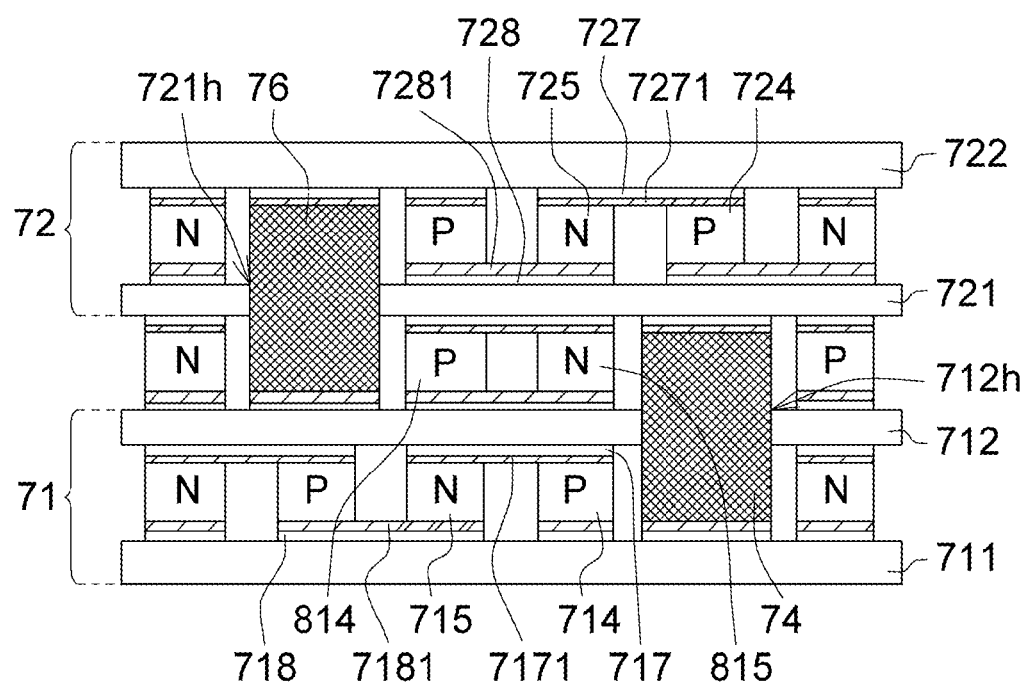

Afterwards, a third substrate 722 is disposed on the second thermoelectric material sets 720, wherein one end of the second heat conductor 76 is connected to the third substrate 722 as shown in FIG. 6E. Thus, a second assembly 72 has been formed by the fourth substrate 721, the third substrate 722 and several second thermoelectric material sets 720 disposed between the fourth substrate 721 and the third substrate 722. The p-type thermoelectric element 724 and the n-type thermoelectric element 725 of each second thermoelectric material set 720 are electrically connected by a conductor 727 (via a conductive bonding material 7271). The n-type thermoelectric element 725 is electrically connected to the p-type thermoelectric element 724 of the adjacent second thermoelectric material set 720 via a conductor 728 (via a conductive bonding material 7281).

After the stacked construction of the first assembly 71 and the second assembly 72 is finished, the method may further include a step of evacuating and vacuum-sealing (not illustrated) to reduce the effect of heat reflow, thereby increasing the reliability of the thermoelectric module.

In the above embodiments, multi-layer thermoelectric module is used for increasing the power generation density of thermoelectric device during power generation, and a heat conductive structure is used for serially connecting the heating ends and the cooling ends of the modules at different layers. Construction of the heat conductor(s) (made of material with high thermal conductivity) and the through hole(s) on the substrate facilitates direct heat transfer between the substrates of the thermoelectric modules of different layers without affecting the temperature at other layers. Therefore, both the high temperature side and the low temperature side of the thermoelectric module respectively maintain the sufficient high and low temperatures, and each layer of thermoelectric module can generate sufficient high electric power. An insulating layer can be formed between the thermoelectric device of an upper layer and the thermoelectric device of a lower layer to avoid the thermal transfer between the two layers. Also, a thermoelectric device can be further disposed to increase power generation density in a practical application. When the stacked thermoelectric structure is combined with a vacuum package, the effect of heat return is reduced and element reliability is increased. The stacked thermoelectric apparatus of the above embodiments is capable of boosting the power generation capacity or the cooling/heating capacity of the thermoelectric device and increasing the efficiency of the thermoelectric apparatus in the application of power generation as well as cooling/heating.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A thermoelectric apparatus, comprising:
a first assembly, comprising:
a first substrate and a second substrate opposite to each other, wherein the first substrate has at least a first through hole; and
a plurality of first thermoelectric material sets disposed between the first substrate and the second substrate, wherein each first thermoelectric material set has a p-type thermoelectric element and an n-type thermoelectric element electrically connected to each other, and the first thermoelectric material sets evolve heat at a first side connecting to the first substrate and absorb heat at a second side connecting to the second substrate;
a second assembly stacked above the first assembly, comprising:
a third substrate and a fourth substrate opposite to each other, wherein the fourth substrate has at least a second through hole, and the fourth substrate is located between the third substrate and the first substrate; and
a plurality of second thermoelectric material sets disposed between the third substrate and the fourth substrate, wherein each second thermoelectric material set has a p-type thermoelectric element and an n-type thermoelectric element electrically connected to each other, and the second thermoelectric material sets evolve heat at a third side connecting to the third substrate and absorb heat at a fourth side connecting to the fourth substrate;
at least a first heat conductor penetrating the first through hole, wherein two ends of the first heat conductor physically connect the second substrate and the fourth substrate respectively, such that a first end of the first heat conductor is in direct physical contact with the second substrate and a second end of the first heat conductor is in direct physical contact with the fourth substrate; and
at least a second heat conductor penetrating the second through hole, wherein two ends of the second heat conductor physically connect the third substrate and the first substrate respectively, such that a third end of the second heat conductor is in direct physical contact with the first substrate and a fourth end of the second heat conductor is in direct physical contact with the third substrate.

2. The thermoelectric apparatus according to claim 1, wherein the n-type thermoelectric element of each first thermoelectric material set is electrically connected to the p-type thermoelectric element of the adjacent first thermoelectric material set, and the n-type thermoelectric element of each second thermoelectric material set is electrically connected to the p-type thermoelectric element of the adjacent second thermoelectric material set.

3. The thermoelectric apparatus according to claim 1, wherein the first substrate has a plurality of first through holes, and the fourth substrate has a plurality of second through holes.

4. The thermoelectric apparatus according to claim 3, comprising:
a plurality of first heat conductors penetrating the first through holes respectively, wherein two ends of each first heat conductor connect the second substrate and the fourth substrate respectively; and
a plurality of second heat conductors penetrating the second through holes respectively, wherein two ends of each second heat conductor connect the third substrate and the first substrate respectively.

5. The thermoelectric apparatus according to claim 4, wherein an opening of each first through hole is larger than a cross-section of each first heat conductor, while an opening of each second through hole is larger than a cross-section of each second heat conductor.

6. The thermoelectric apparatus according to claim 4, comprising:
a plurality of first thermal insulating materials disposed between the first through holes and the first heat conductors respectively for isolating thermal transfer between the first heat conductors and the first substrate; and
a plurality of second thermal insulating materials disposed between the second through hole and the second heat conductors respectively for isolating thermal transfer between the second heat conductors and the fourth substrate.

7. The thermoelectric apparatus according to claim 4, comprising:
a plurality of first thermal insulating materials surrounding the first heat conductors respectively; and
a plurality of second thermal insulating materials surrounding the second heat conductors respectively.

8. The thermoelectric apparatus according to claim 1, wherein two ends of the first heat conductor penetrate the second and fourth substrates respectively, and two ends of the second heat conductor penetrate the first and third substrates respectively.

9. The thermoelectric apparatus according to claim 1, further comprising:
a plurality of third thermoelectric material sets disposed between the first substrate and the fourth substrate, and each third thermoelectric material set has a p-type thermoelectric element and an n-type thermoelectric element electrically connected to each other.

10. The thermoelectric apparatus according to claim 9, wherein of the third thermoelectric material sets, the n-type thermoelectric element of each third thermoelectric material set is electrically connected to the p-type thermoelectric element of the adjacent third thermoelectric material set.

11. The thermoelectric apparatus according to claim 1, being constructed in a form of a vacuum sealing structure.

12. The thermoelectric apparatus according to claim 11, further comprising a sealing material disposed between the second substrate and the third substrate for sealing the thermoelectric apparatus.

13. The thermoelectric apparatus according to claim 1, wherein the first heat conductor and the second heat conductor respectively are a heat conductive pillar.

14. The thermoelectric apparatus according to claim 1, wherein the first heat conductor and the second heat conductor can be made of metal or ceramic material.

15. The thermoelectric apparatus according to claim 1, wherein the first heat conductor and the second heat conductor are respectively disposed by soldering.

16. The thermoelectric apparatus according to claim 1, wherein the p-type and n-type thermoelectric elements comprise bismuth telluride ($Bi_2Te_3$), lead telluride (PbTe), tin telluride (PbSnTe), silicon (Si), silicon germanium (SiGe), half-Heusler alloy, silicide or tungsten diselenide ($WSe_2$).

17. The thermoelectric apparatus according to claim 1, wherein the first and third substrates and the second and fourth substrates are made of a ceramic material, or a silicon or metal base whose surface is covered by an insulating material.

* * * * *